United States Patent [19]

Bershteyn

[11] Patent Number: 5,485,471
[45] Date of Patent: Jan. 16, 1996

[54] SYSTEM FOR TESTING OF DIGITAL INTEGRATED CIRCUITS

[75] Inventor: Mikhail Bershteyn, Campbell, Calif.

[73] Assignee: Mitsubishi Electric Research Laboratories, Inc., Cambridge, Mass.

[21] Appl. No.: 138,135

[22] Filed: Oct. 15, 1993

[51] Int. Cl.$^6$ ................................................. G06F 11/263
[52] U.S. Cl. ............................................ 371/27; 371/22.5
[58] Field of Search ................. 371/27, 225; 324/158.1, 324/73.1

[56] References Cited

U.S. PATENT DOCUMENTS

| | | | |
|---|---|---|---|
| 4,688,223 | 8/1987 | Motiha et al. | 371/27 |
| 5,027,353 | 6/1991 | Jarwala et al. | 371/27 |
| 5,187,712 | 2/1993 | Malleo-Roach et al. | 371/22.5 |
| 5,323,400 | 6/1994 | Agarwal et al. | 371/27 |
| 5,414,716 | 5/1995 | Bershteyn | 371/27 |

*Primary Examiner*—Emanuel T. Voeltz
*Assistant Examiner*—Hal D. Wachsman
*Attorney, Agent, or Firm*—Robert K. Tendler

[57] ABSTRACT

In integrated circuit testing which involves partitioning of tailored test vectors into subsets and filling of the subsets with similar vectors starting with vectors close to the initially selected vector and continuing to add vectors farther away until an optimal number of vectors are in the subset, a system is provided for selecting a number of test vectors to go into a subset by using a unique "distance" measure to measure how far away the candidate vector is from what is already in the subset. Distance determination involves comparing the candidate vector with the weights generated from randomization of the previous vectors in the subset. Having provided a unique distance or "closeness" measure for each candidate vector, the distance of a number of candidate vectors is ascertained. The one with the smallest distance from those vectors already in the subset is selected for determination as to whether its inclusion in the subset results in more rapid and accurate fault detection. This determination is made based on a prediction algorithm which includes calculation of the mathematical expectation of the number of tailored vectors not appearing in a weighted random sequence.

9 Claims, 5 Drawing Sheets

AVERAGE NUMBER OF MISSED PATTERNS IN SUBSET Q $$M(Q) = \sum_{\tau \varepsilon Q} e^{-K\pi_\tau}$$ ←102

SUBSET SELECTION CRITERION:

PATTERN $t_{i+1}$ WILL BE ADDED TO SUBSET $Q_i$ IF ←104

SYSTEM FOR TESTING OF DIGITAL INTEGRATED CIRCUITS

FIELD OF INVENTION

This invention relates to electronic circuit testing and more particularly to the testing of very large integrated circuit devices.

BACKGROUND OF THE INVENTION

As described in U.S. Pat. No. 4,688,223 issued to Motika and Waicukauski and incorporated herein by reference, complex large scale integrated circuit devices fabricated on a single semiconductor chip contain thousands of functional circuit elements which are inaccessable for discrete testing. Because of the complexity of the internal interconnections and their combinational interdependencies, testing for device integrity becomes even more time consuming as the number of individual components on the die increases. Recently, as the number of circuit elements increases from thousands to hundreds of thousands, the amount of time and storage necessary in testing such components increases even more dramatically than described in the above-identified patent.

Integrated circuits of such complexity are known to be tested by applying random test pattern of logic signals to the inputs to these circuits. The test pattern consists of "1"s and "0"s, with the frequency of occurrence of the "1"s or "0"s on a given primary input being determined by a so-called weighting factor.

As used herein, weighting refers to controlling the relative frequency of "1s" and "0s" in a random sequence of logic signals used to test digital circuits. Thus, for purposes of the present discussion, weighting defines the frequency of the "1" values in this sequence compared to the frequency of the "0" values. A weighting of 9/10 means that 9 "1s" are produced to every "0" produced. When the frequency of "1s" equals the frequency of "0s", the sequence is called non-weighted or uniformly distributed.

Weighting as applied to pseudo-random number generation is expressed in terms of the probability that in a given pattern a "1" or a "0" will be generated. This may be expressed in terms of a ratio or percentage.

In general, testing requires the delivery of certain values, "1"s or "0"s, to the circuit and detecting the response of the circuit. In particular, the values to be delivered to the circuit under test can be carefully calculated (manually or by using test generation programs) in such a way that any anticipated failure of the circuit could be detected by observing the response of the circuit to these values. As is common, vectors or patterns of input values are specifically tailored for detection of anticipated failures of a circuit. As used herein, these vectors are referred to as "tailored vectors".

Contrary to this tailored vectors approach, in a so-called random test system the stimulating input vectors for the circuit under test are generated at random. There are several considerations in favor of random testing approach. First, large memories that are necessary to store tailored vectors are not needed in a random test system. Secondly, tailored vectors are highly focused on the anticipated failures in the logic circuits. With limited knowledge of the physical processes going on during semiconductor manufacturing, and numerous uncontrollable factors that influence these processes, real failures that appear in very large scale integration circuits (VLSI) may be quite different from those anticipated. In that case, test vectors too focused on the limited model of anticipated failures may be of little value. Studies, for example the article by J. Waicukauski and E. Lindbloom entitled Fault Detection Effectiveness of Weighted Random Patterns, in Proceedings of International Test Conference, 1988, pp. 245–249 indicate that given the same level of detection of anticipated failures, random test sequences far exceed the tailored test vectors in their ability to detect unanticipated defects actually observed in the field.

However, a completely random number generation for testing of circuits is simply impossible to implement due to the numbers of combinations of "1"s and "0"s which would adequately test the circuit even for anticipated failures.

The problem with completely random number generation is that there may be circuit elements which will not be tested. This is because exercising these elements requires the coincidence of a large number of random events which will not occur within a practical amount of time.

To overcome this, systems have been developed that change the probabilities for the generation of "1s" or "0s" in the random input signals in such a way that the necessary coincidence happens more frequently. This is done by using a weighted random number generator. By techniques that are well known, a particular weight causes more frequent generation of "1s" or "0s" on a given primary input as necessary for exercising the particular circuit.

The problem with this approach is that many circuits impose conflicting requirements for testing their circuit elements. Thus one element may require a large number of "1s" at a given primary input, where another element may require a larger number of "0s". The Motika et al. patent does not address this issue but rather averages for conflicting requirements. As a result, this system does not permit testing many potential faults.

One possible solution is using different weights for the elements with conflicting requirements, thus creating several sets of input weights. In order to calculate the optimal values of input weights several techniques have been proposed. For example, H. Wunderlich in an article entitled Multiple Distributions for Biased Random Test Patterns, IEEE Transactions on Computer-Aided Design, vol. 9, No. 6, June 1990, pp. 584–593 describes a method based on deriving detection probability equations for anticipated failures and optimizing them. Similar technology is also described by R. Lisanke, F. Brglez, and A. Degeus in an article entitled Testability-Driven Random Test-Pattern Generation published in IEEE Transactions on Computer-Aided Design, Vol. CAD-6, No. 6, November 1987, pp. 1082–1087. This technique is extremely complicated and cannot be used for VLSI with large number of logic elements.

A more realistic approach to calculating multiple sets of weights for random testing of VLSI is based on the use of predefined tailored test vectors that are guaranteed to detect the anticipated failures. In order to guarantee detection of all the anticipated failures, the set of tailored test vectors needs to be divided into subsets which will test different portions of the circuit under test. The division of the tailored vectors into subsets is done in such a way that for each subset one weight can be calculated for every circuit input in such a manner that a weighted random sequence of test signals called "patterns" will contain all tailored test vectors selected for this subset. In order for this to happen, the vectors selected to be placed into a subset have to be similar to each other in that the random weights generated from the selected vectors produce similar test signals. For example, J. Waicukauski, E. Lindbloom, E. Eichelberger, and O. Forlenza in a paper entitled A Method for Generating Weighted Random Test Patterns, in IBM Journal of Research and Development, vol. 33, No. 2, March 1989, pp. 149–161 will allow the vectors selected into a subset to have no more than 5 conflicting values for any inputs of the circuit under test. Similarly, F. Brglez, C. Gloster, G. Kedem in a paper entitled Built-In Self-Test with Weighted Random Pattern Hardware, in the Proceedings of International Conference on Computer Design, 1990, pp. 161–166 requires that the cumulative fault detection probability of all vectors in the subset exceeds 95%. In both cases partitioning of tailored vectors into the subsets and calculation of weights is based on arbitrary requirements that have no justification related to the problem of accurately checking VSCI circuits having large numbers of differing circuits.

More particularly, in these papers the distance from a candidate vector to a subset of already selected vectors is defined as the number of bit positions in the candidate vector where the candidate vector has one logic value, while at least one of the vectors that is already selected into the subset has the opposite logic value.

The problem with such approach is that it does not take into account just how many of the vectors already selected into the subset have a logic value in a given bit position which is opposite to the one in the candidate vector. This can lead to a wrong selection as can be seen from a following example.

Let the original set of tailored vectors be 000, 001, 010, 100, 111, 110, 101, 011. Let the currently selected subset be composed of vectors 000, 001, 010.

According to the distance definition of the above-mentioned paper of J. Waicukauski et al., the closest to this subset out of the remaining vectors is 011, with the distance equal to 2, while obviously 100 has more similarity to those selected vectors in a sense of the possibility of them being included into the same weighted random sequence.

SUMMARY OF THE INVENTION

In order to provide rapid complete testing of digital integrated circuits, deterministic integrated circuit testing involves partitioning of tailored test vectors into subsets, and requires filling of the subsets with similar vectors starting with vectors close to the initially selected vector and continuing to add vectors farther away until an optimal number of vectors are in the subset.

To do this, a system is provided for selecting which test vectors go into a subset by first using a unique "distance" measure to measure how far away the candidate vector is from what is already in the subset. When a number of candidate vectors have been measured for distance, the one with the shortest distances is chosen and then analyzed to ascertain if adding this vector to the subset would increase the number of useful vectors in a random test sequence. The system thus provides a unique procedure for adding new successively distant vectors to a subset until such time as adding another more distant vector would result in a decrease in the number of useable vectors, at which time no more vectors are added to the subset. Having closed a subset to further additions, a unique method is used to turn the vectors in the subset into weights for the random weight generator.

More specifically, in integrated circuit testing which involves partitioning of tailored test vectors into subsets and filling of the subsets with similar vectors starting with vectors close to the initially selected vector and continuing to add vectors farther away until an optimal number of vectors are in the subset, a system is provided for selecting a number of test vectors to go into a subset by using a unique "distance" measure to measure how far away the candidate vector is from what is already in the subset. Distance determination involves comparing the candidate vector with the weights generated from randomization of the previous vectors in the subset. Having provided a unique distance or "closeness" measure for each candidate vector, the distance of a number of candidate vectors is ascertained. The one with the smallest distance from those vectors already in the subset is selected for determination as to whether its inclusion in the subset results in more rapid and accurate fault detection. This determination is made based on a prediction algorithm which includes calculation of the mathematical expectation of the number of tailored vectors not appearing in a weighted random sequence.

More particularly, instead of using distance equal to the number of bit contradictions between a candidate vector and the previous vectors in a subset as in the prior art, the distance of a vector from a subset of previous vectors is measured by the distance of this vector from the weights generated from this subset. This distance is estimated as a sum of elementary distances from each logic value in a vector to a corresponding weight. Elementary distance is defined as follows. If a logic value is 0, the distance is equal to the weight itself. If a logic value is 1, distance is equal to one minus the weight. If the logic value is X, then the distance is 0. The distance is also 0 if the weight was not previously defined, e.g. when all other vectors in a subset have an X in the corresponding position. In case two or more vectors have the same distance to a given weight set then the one selected is the one that turns less previously undefined weights into some exact number or weight.

Having established a vector whose gross distance is minimal among the ones being considered for adding this new vector to the subset, the system includes a prediction mechanism dependent upon the number of tailored vectors that could be expected to appear in a weighted random test sequence based on randomization of the subset of vectors including and excluding the candidate vector. If the prediction, $P_N$, for the subset that includes candidate vector is better, then the new candidate vector is included into the subset, otherwise the candidate vector is dropped. To make the prediction, $P_N$, of the number of tailored vectors to appear in the random sequence, the mathematical expectation of the number of tailored vectors not appearing in a weighted random sequence $M(Q)$ is subtracted from the number, $N_S$, of vectors in the subset, such that $P_N = N_S - M(Q)$. The mathematical expectation $M(Q)$ is computed using the formula $$M(Q) = \sum_{t \in Q} e^{-K\pi_t} \qquad \text{(Equ. 1)}$$

where K is the length of random test sequence, $\pi_t$ is the probability of tailored vector t belonging to subset Q to appear as a result of random vector generation.

New tailored vectors cease to be added to the subset and the subset is closed after the predicted number of tailored vectors to appear in a random sequence, $P_N$, fails to increase as compared to the prediction made before the last candidate pattern was considered as part of the subset.

After the subset is closed, in one embodiment, the following algorithm which incorporates an importance factor calculates weights for each input to the circuit under test. First, for each vector an importance factor which is inversely proportional to the number of "don't care" values in a vector is calculated to be equal to the number of logic values in the vector that are not equal to a "don't care" value, X. Then to calculate weight for any given input of the circuit under test, all importance factors for vectors that have value "1" are added and noted beside the input. Then for each column corresponding to an input, the importance factor for each vector is ascertained assuming its value at this column is not X. Then all of these last-mentioned importance factors are added. Finally, the first sum is divided by the second sum to obtain the weight for the corresponding input.

Thus, as can be seen an original set of tailored vectors is provided to be used in the various subsets. For each subset, a set of input weights is created that controls the random sequence of test vectors generated for the subset in such a way that the tailored vectors appear in a subset within as short testing time as possible. For partioning of the original set of tailored vectors, an iterative procedure is employed in which candidate vectors for inclusion into the partitioned subset are extracted one by one from the remaining set of original tailored vectors. The selection of a candidate vector is done based on the least distance, or difference of this candidate, first from an initially selected tailored vector, and then from those vectors subsequently included into the subset. After the candidate is selected the decision is made of whether or not the inclusion of this vector into the subset would actually decrease the overall testing time. If the decision is positive, this vector is included into the subset and the system proceeds to select the next candidate in an iterative fashion. If the decision is negative the candidate vector is rejected and the processes is stopped, with the current composition of the subset then becoming final. Based on this composition, the set of input weights for the random number generation is computed using a procedure known as randomization.

Note, the quality of such partitioning and therefore the overall test time depends fundamentally upon three factors such as how well the selection of the next candidate vector is performed or in other words, how the distance, or difference, between the vectors is evaluated numerically; how well the decision-making is performed as to whether or not the selected vector should be included into the current subset; and how well the randomization is done of a given subset of tailored vectors in order to produce the set of input weights for a random test sequence which would be expected to include those tailored vectors which compose the subset.

In the Subject System the distance definition takes into account the relative frequency of contradictory values in the selected subset. In order to do this the distance of a vector from a subset of other vectors is measured by the distance of this vector from the weights set generated from this same subset. Furthermore, as described above, this distance is estimated as a sum of elementary distances from each logic value in a vector to a corresponding weight. For example, let tailored vectors 0x11 and 1x1x be already included into the subset. As shown in Table I, the weights computed by randomization of these vectors will be ½, ?, 1, 1 where "?" denotes an undefined value that corresponds to the position in which all selected vectors have "x".

TABLE I

| 0 | x | 1 | 1 |
|---|---|---|---|
| 1 | x | 1 | 1 |
| 1/2 | ? | 1 | 1 |

Let two candidates be considered next: 0x10 and 11x0. Both of these candidate vectors have distance 1.5 from the existing subset. This can be seen as follows: when 0 x 1 0 is compared to ½ ? 1 1, then distance as computed by the above elemental distance analysis is ½+ 0+ 0+ 1= 1.5. Likewise, when 1 1 0 x is compared to ½ ? 1 1, the distance is ½+ 0+ 1+ 0= 1.5. As shown in Table II, if the first candidate is selected then randomization of new subset yields W= ⅓, ?, 1, ⅔.

TABLE II

| 0 | x | 1 | 1 |
|---|---|---|---|
| 1 | x | 1 | 1 |
| 0 | x | 1 | 0 |
| 1/3 | ? | 1 | 2/3 |

As shown in Table III, if the second candidate is selected, then randomization of the new subset yields weights of ⅔ 1 1 ⅔.

TABLE III

| 0 | x | 1 | 1 |
|---|---|---|---|
| 1 | x | 1 | 1 |
| 1 | 1 | x | 0 |
| 2/3 | 1 | 1 | 2/3 |

Note, the first candidate will be selected because it leaves one position ("?") of the resulting weight set undefined.

Finally, in generating weights after one has completed the subset, prior randomization schemes have proven to be inadequate. For instance, the randomization according to above mentioned paper of J. Waicukauski et al. is done trivially by assigning "high" probability value (e.g. $15/16$) to those inputs where all vectors in the subset contain 1, assigning "low" probability (e.g. $1/16$) to those inputs where all vectors contain 0 and assigning weight ½ to the rest of inputs.

A more advanced but deficient randomization function is presented in the above mentioned paper of F. Brglez et al. It suggests counting the number of "1s" in a given position of selected vectors and dividing it by the total number of selected vectors that have some logic value (other than "don't care") in this position. This randomization function does not account for different numbers of "don't care" values in different vectors and thus the different importance of these vectors for overall quality of the test.

The present system includes an importance factor equal to the number of logic values in the vector that are not equal to X. Then to calculate weights for any given input of the circuit the system adds all importance factors for patterns that have a value "1" for this input. Then it adds all importance factors for patterns that have a value for this input not equal to X. Finally it divides the first number by the second to yield the optimal weight.

BRIEF DESCRIPTION OF THE DRAWINGS

These and other features of the Subject Invention will be better understood taking in view of the Detailed Description taken in conjunction with the Figures of which:

FIG. 4 is a chart illustrating the algorithm of vector set partitioning;

DETAILED DESCRIPTION

Figure 1:
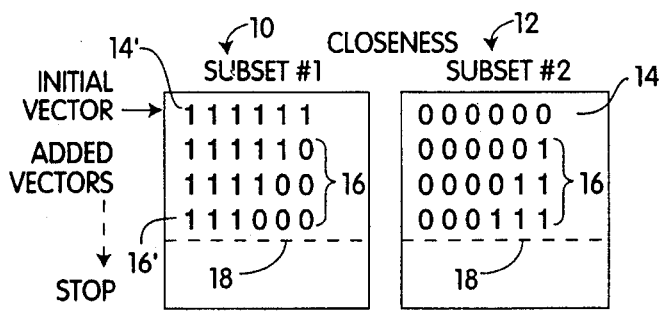
FIG. 1 is a diagrammatic representations of the insertion of candidate vectors in subsets of vectors, in which vectors are added to the subset until such time as they are sufficiently far from the initial vector that they are no longer useful in testing a particular portion of the circuit under test.

Referring now to FIG. 1, it will be appreciated that in order to efficiently and accurately test integrated circuits, it is important to generate a number of test vectors which are utilized in controlling a random number generator through the generation of weights which control the random number generator.

In order to do this, a set of tailored vectors suitable for the circuit is identified. These tailored vectors are subdivided into subsets 10 and 12, with each set including an initial vector 14 and subsequently added vectors 16 to fill up the subset. It is the purpose of the subsets to provide vectors appropriate for checking circuits having testing characteristics which require similar test signals. In order to do this, and as illustrated in FIG. 1, in the past vectors further and further from the initial vector were added until such time as the added vectors were too far away from the initial vector.

Note, the purpose of providing this subset of vectors is to calculate weights which go from an ideal set of weights for checking a particular fault to less and less ideal weights, until the process of adding vectors is stopped as illustrated by dotted line 18 when the added vectors are so far away from the initial vector, they are no longer useful.

The problem in the prior art with the vector selection is that where to stop adding vectors to the subset was a highly arbitrary decision. Arbitrarily measuring distance as the difference between for instance, a candidate vector 16' and an initial vector 14 merely by comparing logic values at a given position, is simplistic and dramatically increases the processing time, or decreases the probability of finding anticipated faults, or both. It will be appreciated that each circuit has characteristics in which there are certain faults which would be anticipated if, for instance, an input line or output line is cut. It is the purpose of any integrated circuit testing scheme to provide test signals to the circuit which will result in all anticipated faults being detected.

Figure 2:
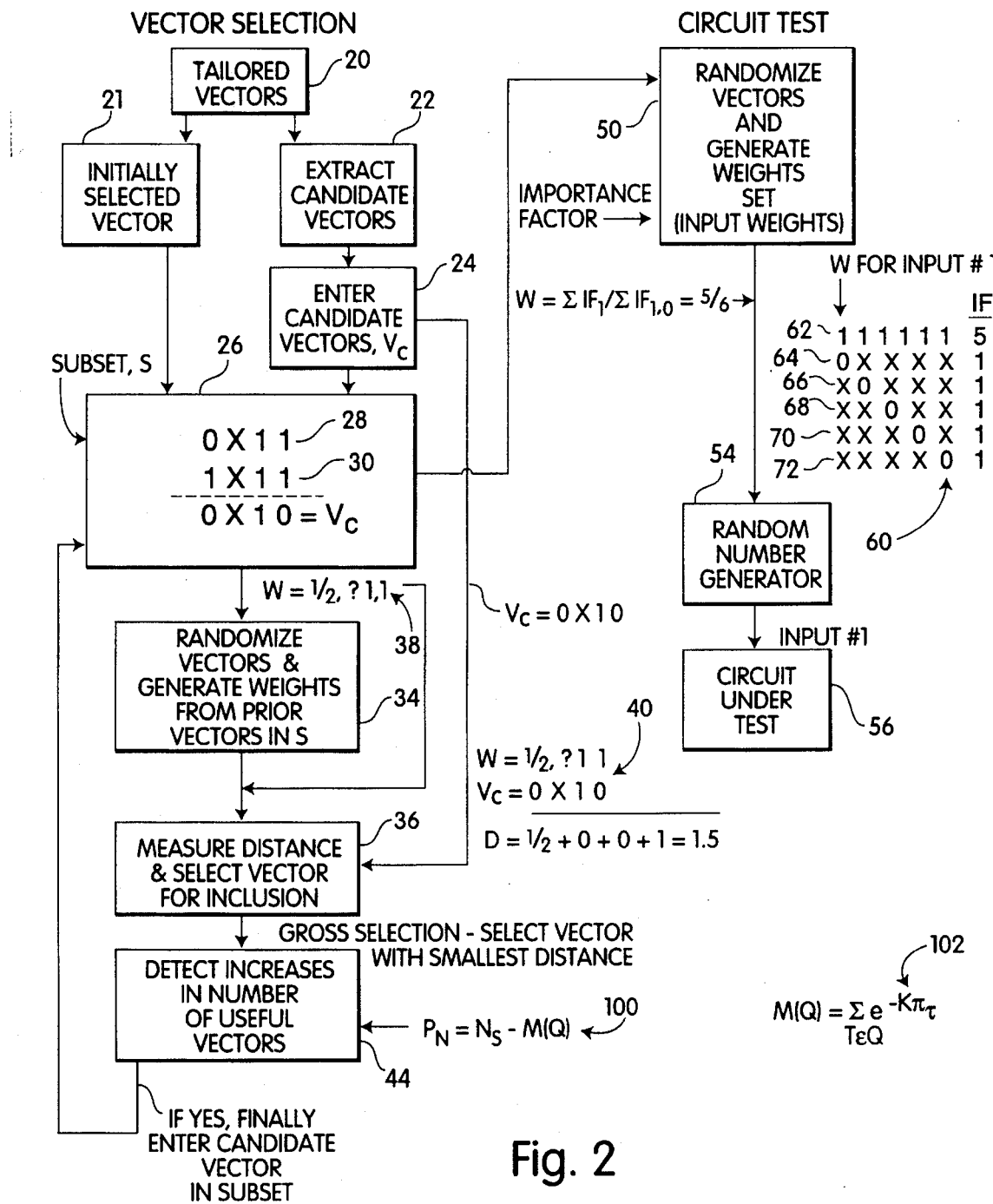
FIG. 2 is a block diagram of the subject invention in which the subset is filled with candidate vectors in accordance with the subject distance determining formula and in accordance with a prediction algorithm which improves the performance of the testing procedure, and in which random number generation is improved through the utilization of random vector weight generation utilizing an importance factor.

Having discussed the inability of prior systems to provide subsets filled in appropriate manner with candidate vectors, in the Subject System, and as illustrated in FIG. 2, tailored vectors 20 are provided, with the tailored vectors being those which are appropriate for the particular circuit under test. Thereafter as illustrated at 21 for a given subset, S, a tailored vector is initially selected. Thereafter candidate vectors are extracted from the vector list, with the candidate vectors being entered as illustrated at 24 into a subset 26.

In the example provided, the initial vector is 0 x 1 1. To this is added another vector, 1 x 1 x, with the total number of prior vectors 28 and 30 in this subset being these last two vectors. It then becomes the problem as to whether a candidate vector, $V_C$, here illustrated at 32 is appropriate to be added to this subset.

In order to ascertain whether it is appropriate to add the candidate vector to the subset, the previous vectors are randomized as illustrated at 34 and weights are generated for these prior vectors in subset S. The rules for randomization and weight generation are as follows:

First, for each vector i the importance factor $w_i$ is calculated equal to the number of logic values in the vector that are not equal to a "don't care" value X. Then the weight for a given primary input j is equal to $$\left( \sum_{t_{ij}=1} w_i \right) / \left( \sum_{t_{ij} \neq X} w_i \right) \qquad \text{(Equ. 2)}$$

where $t_{ij}$ is a logic value in position j of test vector i.

Having derived the weights for vectors 28 and 30 from the above formulas, it will be appreciated that the randomized vector weights for vectors 28 and 30 as combined would be W= ½ ? 1, 1.

As illustrated at 36, in order to measure the distance from the candidate vector $V_C$ and the candidate vector 32 is compared with weights 38 so as to be able to derive a distance. It will be appreciated that the distances are derived by comparing the logic values of the candidate vector to the weight at the corresponding position. This is illustrated at 40 such that the distance of candidate vector 32 is equal to ½+ 0+ 0+ 1= 1.5. The rule for determining distance is given as follows $$D = \sum_{j=1}^{M} d_j \qquad \text{(Equ. 3)}$$

where M is the number of bits in each test vector. Elementary distance $d_j$ is calculated as $$d_j = \begin{cases} w_j & \text{if } t_j = 0 \\ 1 - w_j & \text{if } t_j = 1 \\ 0 & \text{if } t_j = X \end{cases} \qquad \text{(Equ. 4)}$$

where $t_j$ is a logical value in position j of the candidate vector d and $w_j$ is a weight calculated for i input j.

After the distance of a particular candidate vector is measured by unit 36, these vectors are selected for inclusion into the subsequent process. At this point the vectors are not immediately added to the subset but are rather evaluated to detect whether a given vector results in an increase in the number of useful vectors. This calculation is accomplished at unit 44 which operates on a estimation principle in which the calculation involves determining the mathematical expectation of the number, $P_N$, of tailored vectors appearing in a weighted random sequence. Note, $P_N = N_S - M(Q)$ where $N_S$ is the number of vectors in a subset and M(Q) is defined in Equation 1. With this mathematical calculation, if in fact the number $P_N$ increases, then the vector having been selected from unit 36 is finally entered into subset 26.

In one embodiment, the vector selected via unit 36 is that vector which has the smallest distance to the priorly entered vectors in the subset.

Alternatively, it is not necessary to store a large number of vectors and their distances. Rather it is possible to iteratively process the vectors, whereby if a vector has the smallest distance amongst these remaining it is automatically processed for usefulness in unit 44.

Having closed the subset to the addition of further vectors, these vectors are utilized in the generation of signals to be applied to a circuit under test. In order to accomplish this, the vectors in the subset are randomized at 50 in accordance with the same formula used in 34.

The calculated weights are to be applied to a random number generator 54 which then generates input signals and applies them to the circuit under test 56 so that it can be adequately tested. In order to more optimize this procedure, an importance factor is calculated for each vector or horizontal row of numbers. As before, the rules for providing the importance factor, IF, are as follows:

Importance factor is calculated as a number of logical values in a horizontal row which are not equal to "X".

As can be seen from the vectors generally indicated by reference character 60, the importance factor for the first vector 62 is "5" as calculated above. The importance factor for subsequent vectors 64, 66, 68, 70 and 72 are respectively "1".

Now when generating the weight for a given input, in this case Input #1, the weight is equal to the sum of the Importance Factors for logic value 1 vectors, in this case 5. This is divided by the sum of all of the importance factors for vectors in this column which do not contain an X or "don't care" in the column, in this case 1+ 5= 6. Thus in this case, the Importance Factor for vector 62 at position 1 is 5 and the Importance Factor for vector 64 at position 0 is 1, yielding a weight ⅚. This is the weight to be applied to random generator 54 so that the generator will couple the appropriate signals to input #1 of the circuit under test.

Figure 3:
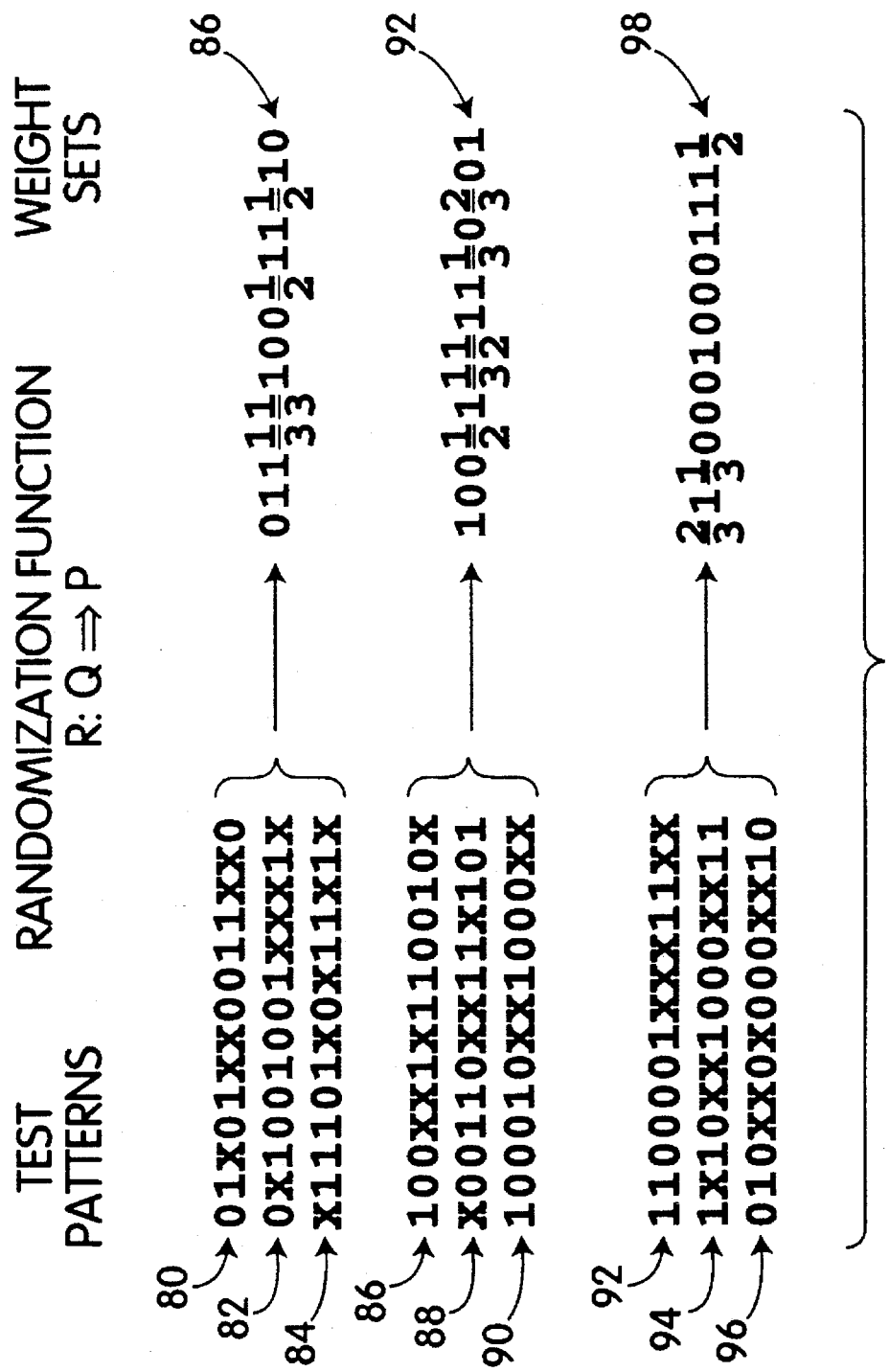
FIG. 3 is a chart illustrating the main principle of weight calculation by test vector randomization.

Referring now to FIG. 3, the result of a weight calculation for series of test patterns or vectors. Here the first set of test patterns involves vectors 80, 82 and 84, which when combined, provides the weight set 86 generated in accordance with the above rules. Likewise, for vectors 86, 88 and 90, the weight set corresponding to this set of vectors is illustrated at 92. Finally, vectors 92, 94 and 96 result in weights 98 as illustrated.

Referring now to FIG. 4, it will be appreciated that the selection criteria for inclusion of a candidate vector into a subset by unit 44 of FIG. 2 is accomplished through the equation 100 of FIG. 2, e.g., $P_N = N_S - M(Q)$. $M_Q$ is defined as illustrated in FIG. 2 by equation 102. As illustrated, a pattern will be added to the subset Q in accordance with equation 104 of FIG. 4 which corresponds to equation 100 of FIG. 2.

Figure 5:
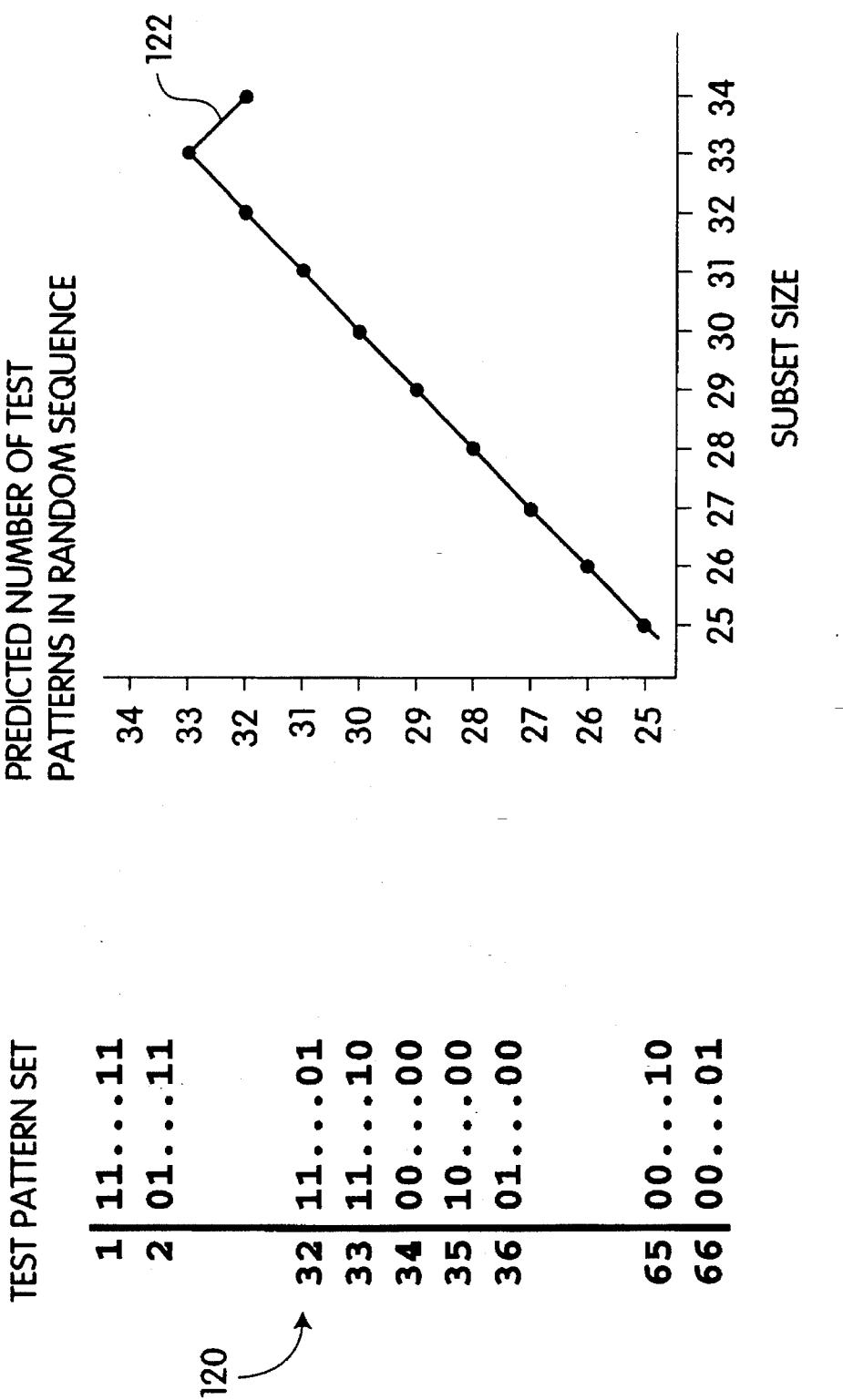
FIG. 5 is a chart showing an example of vector or pattern coverage prediction and its use for vector set partitioning.

Referring now to FIG. 5, the number $P_N$ is in fact the predicted number of test patterns in the random sequence such that for a test pattern set 120 it can be seen that the subset is limited after the 33rd introduction of a candidate vector because the predicted number of test patterns in the random sequence decreases as illustrated at 122. It will be appreciated that the abscisa of this graph refers to the number of patterns or vectors in a given subset or partition, whereas the ordinate relates to the expected number of generated vectors appearing in a weighted random sequence.

Figure 6:
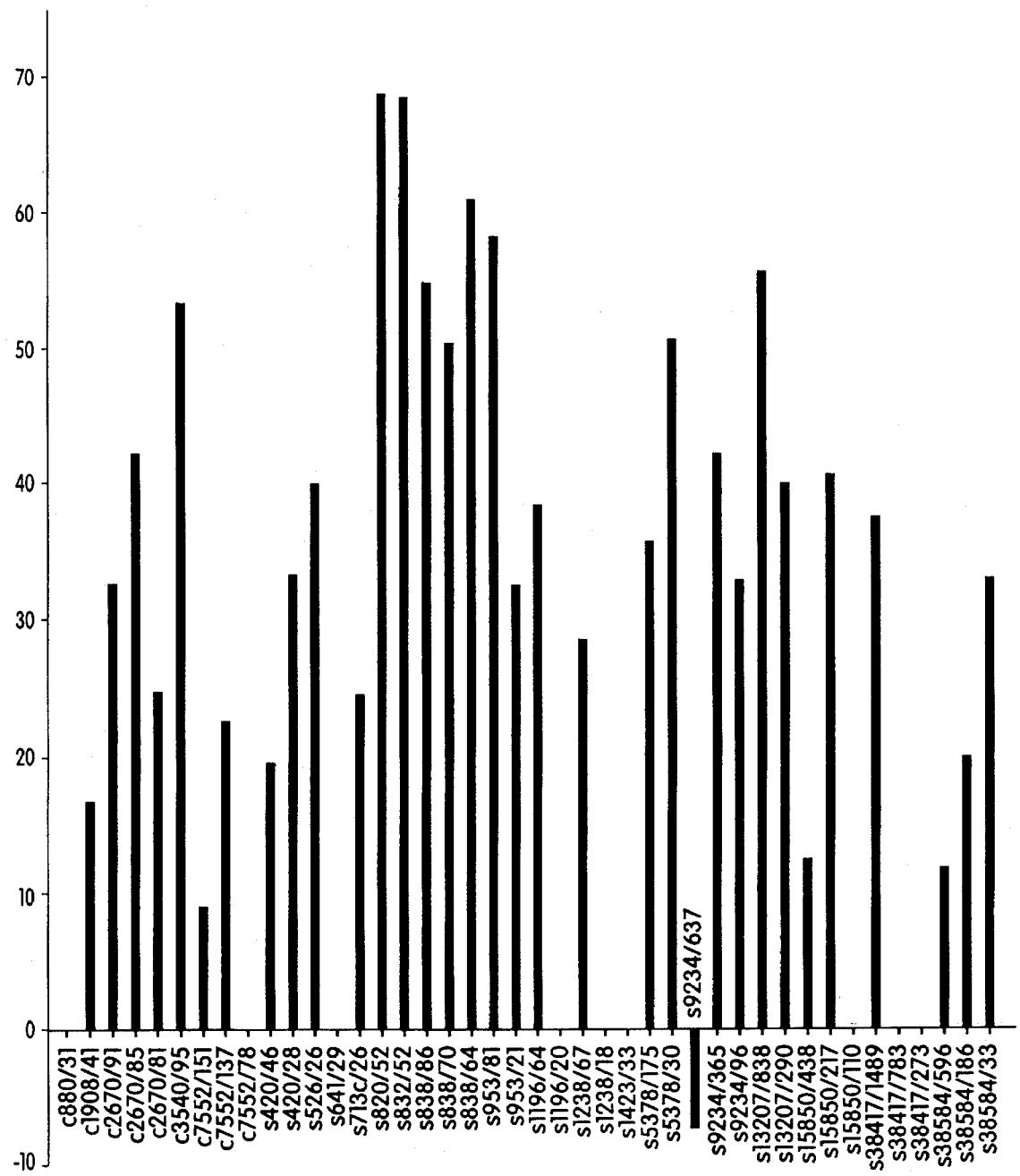
FIG. 6 is a graph describing experimental results showing the advantage of presented system over the prior art.

Referring to FIG. 6, what is shown is the reduction of the number of weight sets compared to the WRP method, described by Waicukauski et al. in a paper entitled *A Method of Generating Weighted Random Test Patterns*, IBM Journal of Research and Development, Vol. 33, No. 2, March 1989, pp. 149–161, where the percent reduction for a given test scenario is listed on the ordinate, whereas the abscisa indicates various standardized test sequences. What will be appreciated is that in general there is anywhere from a 12% to 68% reduction in the number of weight sets need be generated in order to appropriately test a given circuit.

In summary, it will be appreciated that in order to achieve rapid deterministic testing, a set of test patterns or vectors is obtained through deterministic test vector generation. Each vector contains a logic value for each primary input of the circuit under test. Each value can be 1, 0, or X which indicates "don't care". An example of a test pattern set is:

TABLE IV

| |
|---|
| 1111111111111111 |
| 0111111111111111 |
| 1011111111111111 |
| 1101111111111111 |
| 100000xxxxxxx111 |
| . . . |

What needs to be calculated are several sets of weights that will allow one to produce a random sequence which will most probably include all test patterns or vectors from an initial or tailored set. Each weight set contains a weight for each primary input of the circuit under test. The weight is a probability of value "1" being applied at this input.

Several weight sets are necessary because some patterns are highly improbable to be produced by using one random sequence with a single set of weights. Consider, for example,

TABLE V

| |
|---|
| 1111111111111111 |
| 0000000000000000 |

In order to obtain several weight sets, one partitions the original set of test vectors into subsets in such a way that only "similar" or "close" vectors get into the same subset. Then a weight set is produced for each subset by a randomization procedure. If the patterns or vectors in a subset were close enough then they would be very likely to appear in the random sequence of "1s" and "0s" produced by the random pattern generator that uses a calculated weight set.

There are three problems one has to solve to make the above procedure efficient. First, one needs to randomize the subset of test patterns to produce weights. Second, one needs to define "closeness" of test patterns or, in other words, the distance between them. That is, how does one tell that a particular pattern is closer to the tailored patterns already selected for a given subset. Third, and importantly, one has to decide when to stop adding patterns or vectors to the current subset and start a new one.

As to subset selection, one can start with an empty subset. Then one adds one pattern at a time to the subset, each time taking the "closest" one to those already selected.

The ultimate goal is to have such a subset of test vectors that when represented with a set of weights and a corresponding random sequence in general, it will contain largest number of test patterns. In order to achieve this, patterns are added to the subset as long as the expected number of them in random sequence grows. The process is stopped as soon as the number starts falling.

As to closeness, the distance of a pattern from a subset of other patterns is measured by the distance of this pattern from the weights set generated from this same subset.

As to the randomization procedure, the importance factor is calculated for each pattern in a subset. This factor, IF, is equal to the number of the logic values in this pattern that are not equal to X. Then to calculate weight for any given input of the circuit one adds all importance factors for patterns that have value "1" for this input. Then one adds all importance factors for patterns that have a value for this input not equal to X. Then one divides the first sum by the second.

By way of further background, testing of digital circuits with randomly generated patterns of "1s" and "0s" for random testing purposes is considered to be an attractive alternative to deterministic methods using stored test patterns, each of which are used to detect a fault in the circuit such as a line stuck at either "0" or "1" regardless of the input signals to the corresponding device. Studies of such methods both in the external and the built-in test environment show several major advantages of random testing. Firstly, it allows significant compaction of test data which is especially important for built-in self-test. Secondly, random testing provides cost-effective means of increasing the coverage of faults not explicitly targeted during deterministic test generation.

In order to successfully use random testing techniques one has to address several problems. The most important of them is achieving an acceptable level of fault coverage for a targeted set of faults, usually single stuck-at faults. Several techniques for probabilistic fault coverage estimation have been developed as described by E. J. McClusky, S. Makar, S. Mourad and K. D. Wagner, in a paper entitled Probability Models for Pseudorandom Test Sequences in the Proceedings of the International Test Conference, 1987, p.p. 471–479. Also, advances in fault simulation technology made it possible to quickly evaluate fault coverage of long random test sequences as described in an article by J. Waicukauski and E. Lindbloom entitled Fault Detection Effectiveness of Weighted Random Patterns, in the Proceedings of International Test Conference, 1988, pp. 245–249.

Studies done using these techniques show fault coverage obtainable with the use of uniformly distributed random test patterns to be unacceptably low. It was observed that most practical as well as benchmark circuits contain so called random pattern resistant structures that are very hard to test using uniformly distributed random sequences. An example of such a structure is an n-input AND gate, for which the probability of detecting stuck-at-one faults at the inputs as well as stuck-at-zero fault at the output falls exponentially with the growth of n.

This observation prompted an improvement to the random testing methods where non-uniform probability distributions of test patterns were used and proved to be effective in numerous cases. This is described by P. Bardell, W. McAnney and J. Savir in a book entitled Built-In Test for VLSI, in Pseudorandom Techniques. John Wilkey & Sons, New York, 1987, 354 p. Random testing with non-uniform input signal distribution is called weighted random testing and the probabilities of input signals being equal to 1 are known as input weights.

Several procedures have been developed for calculating optimal weights and are described in the above book by P. Bardell, W. McAnney and J. Savir; by J. Waicukauski, E. Lindbloom, E. Eichelberger and O. Forlenza in an article entitled A Method for Generating Weighted Random Test Patterns, in the IBM Journal of Research and Development, vol. 33, No. 2, March 1989, pp. 149–161; by V. D. Agrawal in an article entitled An Information Theoretic Approach to Digital Fault Testing in the IEEE Transactions on Computers, vol. C-30, August 1981, pp. 582–587; by R. Lisanke, F. Brglez and A. Degeus in an article entitled Testability-Driven Random Test-Pattern Generation in the IEEE Transactions on Computer-Aided Design, vol. CAD-6, No. 6, November 1987, pp. 1082–1087; by H. Wunderlich in an article entitled PROTEST: A Tool for Probabilistic Testability Analysis in the Proceedings of Design Automation Conference, 1985, pp. 204–211; and again by H. Wunderlich in an article entitled On Computing Optimized Input Probabilities for Random Tests published in the Proceedings of Design Automation Conference, 1987, pp. 392–398. Some of the above systems are heuristic, based on circuit structure analysis. Others are based on analytical calculation of fault detection probabilities and use optimization, hill climbing, techniques to reach a maximum of these probabilities in the n-dimensional space of input weights. Attempts were also made to obtain optimal weights by randomizing the set of functional test vectors for a circuit as described in an article by F. Siavoshi entitled WTPGA: A Novel Weighted Test-Pattern Generation Approach for VLSI Built-In Self Test in the Proceedings of International Test Conference, 1988, pp. 256–262. For many circuits the results of weighted random testing are significantly better than those obtained with uniformly random tests both in terms of fault coverage and test length. However, as described by E. Eichelberger, E. Lindbloom, J. Waicukauski and T. Williams in a book entitled Structured Logic Testing, published by Prentice Hall, Englewood Cliffs, N.J., 1991, 183 p., it was further observed that some structures in logic circuits are resistant even to weighted random testing. The classical example of such a structure is n-input AND gate and an n-input OR gate which have their corresponding inputs connected. Obviously, detecting faults at the terminals of the AND gate require the values of input weights to be different from those necessary for the OR gate. Averaging on these requirements as suggested by the known weight calculation techniques will produce patterns with a uniform distribution which have been proven ineffective for both gates.

Based on this experience, it was conjectured that high fault coverage can only be obtained by weighted random tests using multiple sets of weights.

The basic idea underlying efforts to calculate multiple weight sets is of partitioning the fault set into subsets that can be covered by a single vector of weights. As described by H. Wunderlich in an article entitled Multiple Distributions for Biased Random Test Patterns published in the IEEE Transactions on Computer-Aided Design, vol. 9, No. 6, June 1990, pp. 584–593, Wunderlich partitions the fault set explicitly by including each fault into one of the partitions in a way that maximizes a cost function based on the gradient of detection probability. The method is expensive computationally and it is only as accurate as the fault detection probability estimation algorithm which is used in these calculations. However, it is known that the exact detection probability calculation problem is NP-complete. Also estimation algorithms which achieve a given level of accuracy in polynomial time can not be built.

It will be appreciated that weighted random test pattern generation has been utilized for a considerable time in the testing of complex circuitry primarily in large scale integration. For reference, such a system is described in U.S. Pat. No. 3,719,885 issued to Robert Gordon Carpenter et al. on Mar. 6, 1973 and incorporated herein by reference.

The problem of randomization of deterministically generated test patterns can be formulated in the following way. Let $T=(T_1, T_2, \ldots T_N)$ be a set of N test vectors for a given circuit. Each vector $T_i$ consists of M values $t_{ij} \in \{0, 1, x\}$ where x represents a "don't care" value. The set T has to be partitioned into the minimal number of subsets as shown in FIG. 1 such that with a given high probability, every member of each subset $Q_i \subseteq T$ will appear at least once in a sequence of no more than K patterns produced by a weighted random pattern generator with weights set $P_i$ calculated for each subset $Q_i$.

For practical purposes an approximation to the optimal solution can be used. Following is the key observation that allows such an approximate solution to be found in polynomial time.

Let us assume that $Q \subseteq T$ is a subset of test patterns. Let us also assume that $P=\{P_1, \ldots P_M\}$ is a set of input weights used to generate patterns belonging to Q. As input signals are assumed to be independent, the probability $\pi_t$ of generating pattern $t \in Q$ can be calculated by multiplying input weights $P_j$ for vector t components $t_j=1$ or their complements $1-p_j$ for $t_j=0$.

The problem of random generation of the patterns from a given set Q is in fact equivalent to the well known occupancy problem W. Feller. An Introduction to Probability Theory and its Applications. Volume 1, John Wiley & Sons, 1970, 509 p. where K balls are randomly distributed among N cells and the number of non-occupied cells is estimated. This number is known to be well approximated by the Poisson distribution (see the above-mentioned book of W. Feller). Therefore if we substitute deterministic test vectors for the cells and random test vectors for the balls, the average number of patterns from Q not present in a random test sequence of length K can be estimated as $$R_Q = \sum_{t \in Q} e^{-K\pi_t} \qquad \text{(Equ. 5)}$$

Based on formula (5) a fast partitioning procedure can be defined by a sequence of steps, each adding one pattern to the partition being formed as shown in FIG. 2. Let us define a randomization function P(Q) that calculates weights set P given a selected subset of test patterns Q. Let us also define distance function D(Q,t) that calculates a measure of difference between test pattern t and a set of test patterns Q. Various randomization functions and distance functions have been proposed in the literature. For example, in J. Waicukauski, E. Lindbloom, E. Eichelberger, O. Forlenza. A Method for Generating Weighted Random Test Patterns. IBM Journal of Research and Development, vol. 33, No. 2, March 1989, pp. 149–161. distance function D(Q,t) is defined as a number of positions in which vector t has 1 (0) and at least one of the patterns in Q has 0 (1). Randomization function of above-mentioned article by F. Brglez et al. defines each individual weight $P_i \epsilon$ P as a ratio between the number of vectors in Q for which the value of bit i is 1 to the number of vectors for which this value is not x (a special "don't care" probability value X could be used in case when all patterns in Q have value x of bit i). Improved randomization and distance functions will be introduced below. However at this point only general meanings of randomization and distance are important for the definition of the partitioning algorithm.

Let us assume that after j iterations partition $Q^{(j)}$ contains j patterns from the original set T. Using a randomization function P(Q) a set of weights $P^{(j)}$ can be found that will produce a set of random patterns most likely to contain each pattern in $Q^{(j)}$. Using distance function D(Q,t) a pattern $t_k \epsilon (T-Q^{(j)})$ can be found for which $D(Q^{(j)}, t_k)$ is minimal. By applying the same randomization function to the set $\{Q^{(j)}, t_k\}$ a new set of weights $p^{(j+1)}$ can be calculated. Now the following decision criterion can be used. If expected number of test patterns to be produced by a random sequence increases by performing the next iteration or in other words if $$j - R_{Q^{(j)}} < j+1 - R\{Q^{(j)}, t_k\} \qquad \text{(Equ. 6)}$$

then $Q^{(j+1)} = \{Q^{(j)}, t_k\}$ and iterations are continued. Otherwise generate a new partition $Q = Q^{(j)}$ and a new set of weights is $P^{(j)}$. After that a new random test sequence has to be simulated with the undetected fault set and test patterns in T that no longer detect any new faults have to be dropped. Then new partitioning can be performed for the remaining test patterns until all faults are detected or some predefined limit (on the number of weight sets or on the number of random test patterns) is exceeded.

In Table VI test patterns for an ANDOR circuit consisting of a 32-input AND gate and a 32-input OR gate with their corresponding inputs connected are presented in a random order. As no criterion has been defined for selecting the first pattern in partition let us assume it will be pattern $t_j$. So using the notation introduced above $Q^{(1)} = \{t_1\}$. Obviously as there are no value contradictions $\pi_1 = 1$. Given K= 300 we will have $R_{Q(1)} = e^{-300} \approx 0$. The choice of minimal distance pattern for a second iteration will produce $t_4$ as $D(\{t_1\}, t_4) = 1$ is minimal. As there is only one contradictory value between two patterns randomization function will produce one weight equal ½ and all others equal 1 (unlike J. Waicukauski, E. Lindbloom, E. Eichelberger, O. Forlenza. A Method for Generating Weighted Random Test Patterns. IBM Journal of Research and Development, vol. 33, No. 2, March 1989, pp. 149–161. this randomization function does not replace 0 and 1 with arbitrarily selected "low" and "high" probability values). Therefore $R_{Q(2)} = 2e^{-150} \approx 0$ and the average number of generated patterns grows by 1. By criterion (4) pattern $t_4$ must be included into the partition. 31 patterns are equally likely to become next candidates all having distance 2 from $Q^{(2)}$ and the choice becomes random. Skipping next 30 iterations, let us assume $$Q^{(32)} = \{t_1, t_4, t_5, t_{11}, t_{12}, t_{13}, t_{15}, t_{18}, t_{20}, t_{21}, t_{22}, t_{24}, t_{26}, t_{27}, t_{29}, t_{32},$$

$$t_{34}, t_{35}, t_{36}, t_{38}, t_{39}, t_{42}, t_{48}, t_{50}, t_{51}, t_{55}, t_{56}, t_{58}, t_{62}, t_{63}, t_{64}, t_{65}\}.$$

TABLE VI

Test Patterns for ANDOR Circuit

| i | $t_i$ | i | $t_i$ | i | $t_i$ |
|---|---|---|---|---|---|
| 1 | 11111111111111101111111111111111 | 23 | 00000000000000000000000010000 | 45 | 00000000000000001000000000000000 |
| 2 | 00000000000000000000000010000000 | 24 | 11111111111111111111101111111111 | 46 | 00000000000000000000000000001000 |
| 3 | 00000000001000000000000000000000 | 25 | 00000000000010000000000000000000 | 47 | 00000000000000001000000000000000 |
| 4 | 11111111111111111111111111111111 | 26 | 11111111111101111111111111111111 | 48 | 11111111111111111110111111111 |
| 5 | 11101111111111111111111111111111 | 27 | 11111111111111111111111011111111 | 49 | 00000000010000000000000000000000 |
| 6 | 00000000010000000000000000000000 | 28 | 00000000000000000000000100000000 | 50 | 11111111111111101111111111111111 |
| 7 | 00000000000000000000000000000000 | 29 | 11111111111011111111111111111111 | 51 | 11111111111111111111111110111 |
| 8 | 00000000001000000000000000000000 | 30 | 00000000000000000000001000000000 | 52 | 00000000000000000010000000000000 |
| 9 | 00000000000000000000000000000001 | 31 | 01000000000000000000000000000000 | 53 | 00000000000000000000000000000100 |
| 10 | 10000000000000000000000000000000 | 32 | 11111111111111111101111111111111 | 54 | 00000000000000000001000000000000 |
| 11 | 11111111111111011111111111111111 | 33 | 00000000000010000000000000000000 | 55 | 01111111111111111111111111111111 |
| 12 | 11111111111111111111101111111111 | 34 | 11111111111111111101111111111111 | 56 | 11111111111111110111111111111111 |
| 13 | 11111111111111101111111111111111 | 35 | 10111111111111111111111111111111 | 57 | 00000100000000000000000000000000 |
| 14 | 00000000000000000000000001000000 | 36 | 11111101111111111111111111111111 | 58 | 11111111111111111101111111111111 |
| 15 | 11111111111111111111111111111011 | 37 | 00000000000001000000000000000000 | 59 | 00000001000000000000000000000000 |
| 16 | 00001000000000000000000000000000 | 38 | 11011111111011111111111111111111 | 60 | 00000000000000000000000000000010 |
| 17 | 00000000000000000000000000100000 | 39 | 11110111111111111111111111111111 | 61 | 00000000000000000001000000000000 |
| 18 | 11111111111111111111111101111111 | 40 | 00100000000000000000000000000000 | 62 | 11111111111111111111111111111110 |
| 19 | 00000010000000000000000000000000 | 41 | 00010000000000000000000000000000 | 63 | 11111111111111111111111111101111 |

TABLE VI-continued

Test Patterns for ANDOR Circuit

| i | $t_i$ | i | $t_i$ | i | $t_i$ |
|---|---|---|---|---|---|
| 20 | 1111011111111111111111111111111 | 42 | 1111111111011111111111111111111 | 64 | 1111111101111111111111111111111 |
| 21 | 1111111111111111111111111111101 | 43 | 0000000000000010000000000000000 | 65 | 1111111110111111111111111111111 |
| 22 | 1111111111111111111111101111111 | 44 | 0000000000000000000010000000000 | 66 | 1111111110111111111111111111111 |

Then formula (5) gives $R_{Q(32)}=0.83$ and pattern $t_6$ is the next candidate with distance 31 from $Q^{(32)}$. This pattern selection is a clear failure of the distance measure used here because even according to common sense $t_{66}$ is a better choice. And in fact for $Q^{(33)}=\{Q^{(32)}, t_6\}$ $R_{Q(32)} \approx 2.91$ and according to (6) $t_6$ should not be included into partition as the average number of generated test patterns goes down by 1.08. On the other hand for $Q^{(33)}=\{Q^{(32)}, t_{66}\}$ $R_{Q(33)} \approx 0.96$ and the average number of generated test patterns goes up by 0.87. After that whatever pattern than can be selected for the 34th iteration would not satisfy criterion (6) and partitioning would be stopped exactly where one would expect it to. In FIG. 5, the expected number of generated deterministic test patterns is plotted against the number of patterns included into the partition. The curve has a clear maximum when 33 patterns are selected.

This example demonstrates how criterion (6) provides an accurate guidance for partitioning test patterns set for the purposes of multiple weights sets calculation. However, it also indicates that the distance measure introduced in J. Waicukauski, E. Lindbloom, E. Eichelberger, O. Forlenza. A Method for Generating Weighted Random Test Patterns. IBM Journal of Research and Development, vol. 33, No. 2, March 1989, pp. 149–161. could be misleading. A natural choice for the distance function could be $D(Q,t)= R_{\{Q,t\}}$. Unfortunately that would mean that expression (5) would have to be evaluated $N(N-1)/2$ times and this could be time consuming for the computers with moderate floating point performance. Similar results can be obtained by using a distance measure $D(Q,t)$ based on comparison between the components of test vector t and of the weights set $P(Q)$ obtained by applying randomization function to the set Q. Let us define a difference $d_j$ between a value $t_j$ 0, 1, x and a weight $p_j \epsilon \{[0,1],X\}$ where X is a special "don't care" value corresponding to the case when all vectors in Q have bit j equal x. Then the value of $d_j$ is defined by Table VII and function $D(Q,t)$ by formula (7) as follows $$D(Q,t) = \sum_{j=1}^{M} d_j \qquad \text{(Equ. 7)}$$

TABLE VII

Distance Component Definition

| | $d_j$ | |
|---|---|---|
| $t_j$ | $p_j \epsilon$ [0,1] | $p_j = X$ |
| 0 | $M*p_j$ | 1 |
| 1 | $M*(1-p_j)$ | 1 |
| x | 0 | 0 |

This function not only considers the values in D that contradict some of the values in Q but it also takes into account relative frequency of contradictions. In addition, if for two vectors distances calculated based on the contradictions with Q (left column of the Table VII) are the same, this function will give preference to the vector that turns fewer "don't care" components of P(Q) into the defined values (right column of the Table VII). This measure also defines the vector with the largest number of "don't care" values as a natural choice for the first iteration. To ensure this it is only necessary to define $Q^{(0)}$ as an empty set and $p(Q^{(0)})$ as a vector consisting of values x.

For the example of the ANDOR circuit distance measure (7) produces $D(Q^{(32)}, t_6)=961$ and $D(Q^{(32)}, t_{66})=63$. Therefore $t_{66}$ will be correctly selected as the next candidate to be included into the partition.

Randomization function P(Q) defined in J. Waicukauski, E. Lindbloom, E. Eichelberger, O. Forlenza. A Method for Generating Weighted Random Test Patterns. IBM Journal of Research and Development, vol. 33, No. 2, March 1989, pp. 149–161. provides a good approximation to the optimal distribution when vectors in the set Q contain few "don't care" values as is the case for vectors in Table VI. However, in practice, test vectors for scan circuits contain a significant number of "don't cares". Table VIII shows a somewhat extreme example of a test pattern set for which this randomization function of the WRP method J. Waicukauski. E. Lindbloom, E. Eichelberger, O. Forlenza. A Method for Generating Weighted Random Test Patterns. IBM Journal of Research and Development, vol. 33, No. 2, March 1989, pp. 149–161. produces results that are very far from optimal.

TABLE VIII

Example of Test Pattern Set with "Don't Care" Values

| i | $t_i$ | i | $t_i$ | i | $t_i$ |
|---|---|---|---|---|---|
| 1  | 1111111111111111111111111111111 | 12 | xxxxxxxxxx0xxxxxxxxxxxxxxxxxxxx | 23 | xxxxxxxxxxxxxxxxxxxxx0xxxxxxxxx |
| 2  | 0xxxxxxxxxxxxxxxxxxxxxxxxxxxxxx | 13 | xxxxxxxxxxx0xxxxxxxxxxxxxxxxxxx | 24 | xxxxxxxxxxxxxxxxxxxxxx0xxxxxxxx |
| 3  | x0xxxxxxxxxxxxxxxxxxxxxxxxxxxxx | 14 | xxxxxxxxxxxx0xxxxxxxxxxxxxxxxxx | 25 | xxxxxxxxxxxxxxxxxxxxxxx0xxxxxxx |
| 4  | xx0xxxxxxxxxxxxxxxxxxxxxxxxxxxx | 15 | xxxxxxxxxxxxx0xxxxxxxxxxxxxxxxx | 26 | xxxxxxxxxxxxxxxxxxxxxxxx0xxxxxx |
| 5  | xxx0xxxxxxxxxxxxxxxxxxxxxxxxxxx | 16 | xxxxxxxxxxxxxx0xxxxxxxxxxxxxxxx | 27 | xxxxxxxxxxxxxxxxxxxxxxxxx0xxxxx |
| 6  | xxxx0xxxxxxxxxxxxxxxxxxxxxxxxxx | 17 | xxxxxxxxxxxxxxx0xxxxxxxxxxxxxxx | 28 | xxxxxxxxxxxxxxxxxxxxxxxxxx0xxxx |
| 7  | xxxxx0xxxxxxxxxxxxxxxxxxxxxxxxx | 18 | xxxxxxxxxxxxxxxx0xxxxxxxxxxxxxx | 29 | xxxxxxxxxxxxxxxxxxxxxxxxxxx0xxx |
| 8  | xxxxxx0xxxxxxxxxxxxxxxxxxxxxxxx | 19 | xxxxxxxxxxxxxxxxx0xxxxxxxxxxxxx | 30 | xxxxxxxxxxxxxxxxxxxxxxxxxxxx0xx |
| 9  | xxxxxxx0xxxxxxxxxxxxxxxxxxxxxxx | 20 | xxxxxxxxxxxxxxxxxx0xxxxxxxxxxxx | 31 | xxxxxxxxxxxxxxxxxxxxxxxxxxxxx0x |
| 10 | xxxxxxxx0xxxxxxxxxxxxxxxxxxxxxx | 21 | xxxxxxxxxxxxxxxxxxx0xxxxxxxxxxx | 32 | xxxxxxxxxxxxxxxxxxxxxxxxxxxxxx0 |
| 11 | xxxxxxxxx0xxxxxxxxxxxxxxxxxxxxx | 22 | xxxxxxxxxxxxxxxxxxxx0xxxxxxxxxx | 33 | xxxxxxxxxxxxxxxxxxxxxxxxxxxxxx0 |

For this pattern set, P(Q) will be a vector of 32 components each equalling ½. Assuming again the expected length of a random sequence K= 300, formula (5) gives an average number of missed patterns $R_Q$=1 which is exactly what one would expect given the extremely low probability of generating $t_1$. A much better approximation can be achieved if the components of vector P are computed as $$P_j = \left( \sum_{t_{ij}=1} w_i \right) / \left( \sum_{t_{ij} \neq x} w_i \right) \quad \text{(Equ. 8)}$$

where $t_{ij}$ is a value of bit j in test vector $t_i$ and $w_i$ is a number of values in a vector $t_i$ that are not equal to x. For example, in Table VIII, $w_1$= 32, $w_2$=. . . = $w_{33}$= 1 and therefore $P_1$= . . . =$P_{32}$= 32/33. In this case $R_Q \approx$ 0.0036 which is a much better result than before. Further improvement can be obtained by treating a randomization function as an optimization problem with cost function (5) but this is again computationally expensive and in fact the approximate solution (8) is good in most practical cases.

5. EXPERIMENTAL RESULTS

Experimental evaluation of the proposed methods was conducted using the standard sets of combinational benchmark circuits F. Brglez, H. Fujiwara. A Neutral List of 10 Combinational Benchmark Designs and a Special Translator in Fortran. Proceedings of International Symposium of Circuits and Systems, 1985, pp. 151–158. and sequential benchmark circuits F. Brglez, D. Bryan, K. Kozminski. Combinational profiles of Sequential Benchmark Circuits. Proceedings of International Symposium on Circuits and Systems, 1989, pp. 1929–1934. in which all flip/flops were considered scannable. In order to produce random pattern sequences, a linear feedback shift register (LFSR) with characteristic polynomial $x^{31} = x^3 + 1$ was used. A random binary signal with given probability p was calculated by arithmetic comparison of the state of LFSR with the value $p*2^{31}$. After generating each random signal the state of LFSR was shifted 31 times in order to prevent dependency between consecutive random values. The same seed value of LFSR was used throughout all experiments, no reseeding was performed. In order to emulate possible hardware implementation more closely, values of weights were rounded to the nearest of the values 0, $2^{-15}$, $2^{-14}$, . . . , ½, . . . , $1-2^{-15}$, 1 (totalling 31 values so that a weight can be encoded by 5 bits). However this approximation did not alter the results significantly comparing to the non-rounded 31-bit binary representation of weights. Fault coverage was evaluated using a pattern-parallel fault simulator for combinational circuits.

Table IX presents the results of experiments with weights calculation algorithm based on test pattern set randomization. Experiments were performed in the following way. Each circuit was first simulated with uniformly distributed random test patterns. Three runs were made for each circuit. During the first run uniform random test generation was stopped after 64 consecutive patterns did not detect any new fault. Then this number was increased to 512 and to 8192. After that tests for the remaining undetected faults were generated by a deterministic test pattern generator that was modified in order to prevent random specification of "don't care" input values. If the resulting test pattern sets contained 15 or more patterns, the procedure defined herein was used in order to produce new set of weights which in turn was simulated until the same number of unsuccessful trials as originally used in uniform random test generation (64, 512 or 8192) were reached. After that the deterministic test pattern set was simulated with the new reduced list of undetected faults, and unnecessary patterns were dropped. Then the next set of weights was calculated and the process repeated until no more test patterns were left. For comparison the weights calculation procedure of the WRP method J. Waieukauski, E. Lindbloom, E. Eichelberger, O. Forlenza. A Method for Generating Weighted Random Test Patterns. IBM Journal of Research and Development, vol. 33, No. 2, March 1989, pp. 149–161. was used under the same conditions. The columns of Table IX correspond to circuit names, numbers of test patterns in original sets computed by deterministic test generator, and the resulting numbers of weight sets and random patterns obtained by proposed method and by the WRP method J. Waicukauski, E. Lindbloom, E. Eichelberger, O. Forlenza. A Method for Generating Weighted Random Test Patterns. IBM Journal of Research and Development, vol. 33, No. 2, March 1989, pp. 149–161.

TABLE IX

Experimental Results of Weights Calculation Method Based on Test Patterns Randomization

| | | Proposed Method | | WRP Method [5] | | | | Proposed Method | | WRP Method [5] | |
|---|---|---|---|---|---|---|---|---|---|---|---|
| Circuit | DTG Patterns | Weight Sets | Test Length | Weight Sets | Test Length | Circuit | DTG Patterns | Weight Sets | Test Length | Weight Sets | Test Length |
| c880 | 31 | 3 | 465 | 3 | 563 | s1196c | 64 | 10 | 2002 | 13 | 1972 |
| c1908 | 41 | 10 | 1253 | 12 | 1430 | s1196c | 20 | 5 | 6424 | 7 | 6051 |
| c2670 | 91 | 9 | 1360 | 12 | 1979 | s1238c | 67 | 9 | 2460 | 14 | 2110 |
| c2670 | 85 | 4 | 4034 | 7 | 7886 | s1238c | 18 | 5 | 8559 | 6 | 7692 |
| c2670 | 81 | 3 | 12593 | 4 | 42437 | s1423c | 33 | 5 | 620 | 5 | 725 |
| c3540 | 95 | 5 | 1298 | 7 | 1673 | s5378c | 175 | 7 | 2270 | 11 | 2692 |
| c7552 | 151 | 12 | 2072 | 12 | 2451 | s5378c | 30 | 4 | 11005 | 6 | 10760 |
| c7552 | 137 | 8 | 4885 | 9 | 11012 | s9234c | 637 | 11 | 3368 | 17 | 4589 |
| c7552 | 78 | 5 | 69495 | 5 | 79086 | s9234c | 365 | 8 | 16391 | 13 | 20720 |
| s420c | 46 | 4 | 532 | 5 | 782 | s9234c | 96 | 4 | 160977 | 6 | 169169 |
| s420c | 28 | 2 | 1825 | 3 | 3065 | s13207c | 838 | 7 | 3430 | 9 | 4935 |
| s526c | 26 | 3 | 643 | 5 | 781 | s13207c | 290 | 4 | 15781 | 5 | 19429 |
| s641c | 29 | 3 | 593 | 3 | 697 | s15850c | 438 | 6 | 3051 | 8 | 3771 |
| s713c | 26 | 3 | 576 | 4 | 545 | s15850c | 217 | 4 | 14767 | 5 | 16273 |
| s820c | 52 | 5 | 1287 | 6 | 1503 | s15850c | 110 | 3 | 141181 | 3 | 146548 |
| s832c | 52 | 4 | 1271 | 6 | 1499 | s38417c | 1489 | 8 | 4972 | 11 | 8584 |
| s838c | 86 | 5 | 893 | 9 | 1341 | s38417c | 783 | 6 | 30663 | 6 | 41063 |
| s838c | 70 | 3 | 3916 | 6 | 5089 | s38417c | 273 | 3 | 277109 | 4 | 304265 |
| s838c | 64 | 2 | 17484 | 5 | 28917 | s38584c | 596 | 7 | 5381 | 9 | 6135 |
| s953c | 81 | 4 | 973 | 7 | 1061 | s38584c | 186 | 5 | 19973 | 5 | 22354 |

TABLE IX-continued

| | | Experimental Results of Weights Calculation Method Based on Test Patterns Randomization | | | | | | | | |
|---|---|---|---|---|---|---|---|---|---|---|
| | | Proposed Method | | WRP Method [5] | | | | Proposed Method | | WRP Method [5] |
| Circuit | DTG Patterns | Weight Sets | Test Length | Weight Sets | Test Length | Circuit | DTG Patterns | Weight Sets | Test Length | Weight Sets | Test Length |
| s953c | 21 | 2 | 3870 | 3 | 4227 | s38584c | 33 | 2 | 107208 | 3 | 118245 |

Although the general tendency is clearly in favor of the method proposed in this paper, individual results are inevitably obscured by the influence of several random factors. Firstly, each run corresponds to a single realization of a random input sequence and therefore it is not impossible that a set of weights which is further from optimal may occasionally produce a test sequence with better fault detection properties. Secondly, each fault in the circuit could be detected by numerous test vectors and therefore the results may depend on which one of them had been chosen by the deterministic test generator. A statistically accurate methodology of evaluation of the quality of the weights sets was demonstrated in W Debany, C. Hartmann, P. Varshney, K. Mehrotra. Comparison of Random Test Vector Generation Strategies. Proceedings of International Conference on Computer-Aided Design, 1991, pp. 244–247. but the complexity of this procedure does not seem to allow its use for large sets of benchmark circuits.

The comparison is further complicated by the fact that in some experimental runs one of the factors (e.g. number of weight sets) demonstrated the advantage of one of the approaches at the same time as the other factor (number of test patterns) preferred a different one. In order to overcome this difficulty another series of experiments was performed where random test length was limited by the number produced by the WRP method and the numbers of weight sets were compared for both the WRP method and the presented algorithm. Results of these experiments are shown in FIG. 6. The percentage reduction of the number of weight sets necessary to achieve 100% test vector coverage with no more test vectors than by the WRP method is plotted for each circuit and deterministic test sequence shown in Table IX. Each position on the horizontal axis of the plot is marked with the circuit name and deterministic test sequence length. Only in one case the number of weight sets actually increased. In most cases however, significant reductions were detected.

Having above indicated a preferred embodiment of the present invention, it will occur to those skilled in the art that modifications and alternatives can be practiced within the spirit of the invention. It is accordingly intended to define the scope of the invention only as indicated in the following claims.

What is claimed is:

1. A machine for use in the testing of digital integrated circuits comprising:

a digital integrated circuit;

random number generator means for generating signals to test said circuit;

means for applying said signals to said circuit for the testing thereof, said random number generator means including:

means for generating test vectors, means for coupling said test vectors to said random number generator, and means for partitioning said test vectors into subsets, said partitioning means including:

means for initially selecting a vector for one of said subsets;

means for filling said one of said subsets with similar vectors starting with a candidate vector close to said initially selected vector and adding dissimilar candidate vectors to said one of said subsets;

means for generating a random sequence of vectors in said one of said subsets including said added candidate vectors to produce a random sequence of vectors including almost all of the vectors in said one of said subsets including said first mentioned candidate vector, but resulting in a random sequence in which some vectors in said one of said subsets are missing due to the randomizing process; and, means for terminating vector additions to said one of said subsets when the number of vectors in said subset minus the number of vectors missed ceases to increase, said means for generating said signals only using those vectors existing prior to the terminating of said vector additions for the control of said random number generator.

2. The machine of claim 1, wherein a candidate vector is selected based on the distance, D, of said candidate vector from the rest of the vectors in said one of said subsets, where said distance D is defined as $$D = \sum_{j=1}^{M} d_j$$

where M is the number of bits in a test vector and wherein elemental distance $d_j$ is defined as:

$$d_j = \begin{cases} w_j & \text{if } t_j = 0 \\ 1 - w_j & \text{if } t_j = 1 \\ 0 & \text{if } t_j = X \end{cases}$$

where $t_j$ is a logical value of a test vector in position j and $w_j$ is the weight calculated for the test vector input j and X= don't care.

3. The machine of claim 2, where said subset is one of said subsets Q and wherein said vector addition terminating means includes means for determining when $P_N = N_S - M$ (Q), the number of missed vectors starts to fall where $N_S$ is the number of vectors in the subset and $$M(Q) = \sum_{t \in Q} e^{-K\pi_t}$$

is the mathematical expectation of the number of missed vectors, where K is the length of a random test sequence, $\pi_t$ is the probability of a vector t belonging to subset Q to appear as a result of random vector generation.

4. The machine of claim 1, wherein said one of said subsets filling means includes:

a set of tailored vectors;

means for initially selecting one of said tailored vectors to be placed in said one of said subsets;

means for entering a candidate vector from said tailored vectors into said one of said subsets;

means for randomizing the tailored vectors in said one of said subsets and generating a weights set corresponding to the inputs represented by the columns of the tailored vectors in said one of said subsets; and, means coupled to said weights set and said candidate vector for determining the distance of said candidate vector from said weights set.

5. The machine of claim 4, wherein the distance D of the candidate tailored vector from said vectors in said one of said subsets is defined as $$D = \sum_{j=1}^{M} d_j$$

where M is the number of bits in a test vector, and $d_j$ is defined as $$d_j = \begin{cases} w_j & \text{if } t_j = 0 \\ 1 - w_j & \text{if } t_j = 1 \\ 0 & \text{if } t_j = X \end{cases}$$

and where $d_j$ is the elemental distance.

6. The machine of claim 4, wherein said vector randomizing and weight set generating means includes:

means for calculating for each test vector an importance factor equal to the number of logic values in said test vector not equal to X where X= don't care;

means for each input for adding all importance factors for those vectors having a value "1" in the vector in the column that corresponds to said input to provide a first sum;

means for each input for adding all importance factors for those vectors having either a value "1" or a value "0" in the vector in the column that corresponds to said input to provide a second sum; and means for providing a weight comprising said first sum divided by said second sum.

7. The machine of claim 1 and further including means for generating a weights set derived from said one of said subsets for use in a random number generator for generating digital signals for the testing of a digital circuit.

8. The machine of claim 7 wherein said weights set generating means includes means for determining an importance factor, IF, for each vector in said one of said subsets, where IF is the number of logical values not equal to X, where X is "don't care".

9. The machine of claim 8, wherein the weight w for each input associated with said one of said subsets of test vectors is defined as $$w = (\Sigma IF_1)/(\Sigma IF_{1,0})$$

where $IF_1$ is the sum of importance factors for vectors having logic "1" values for a given input and $IF_{1,0}$ is the sum of importance factors for vectors for said given input which do not contain X.

* * * * *